March 3, 1970 H. H. JONES ET AL 3,498,823
ELECTROLESS TIN PLATING ON ELECTROLESS NICKEL
Filed July 11, 1967
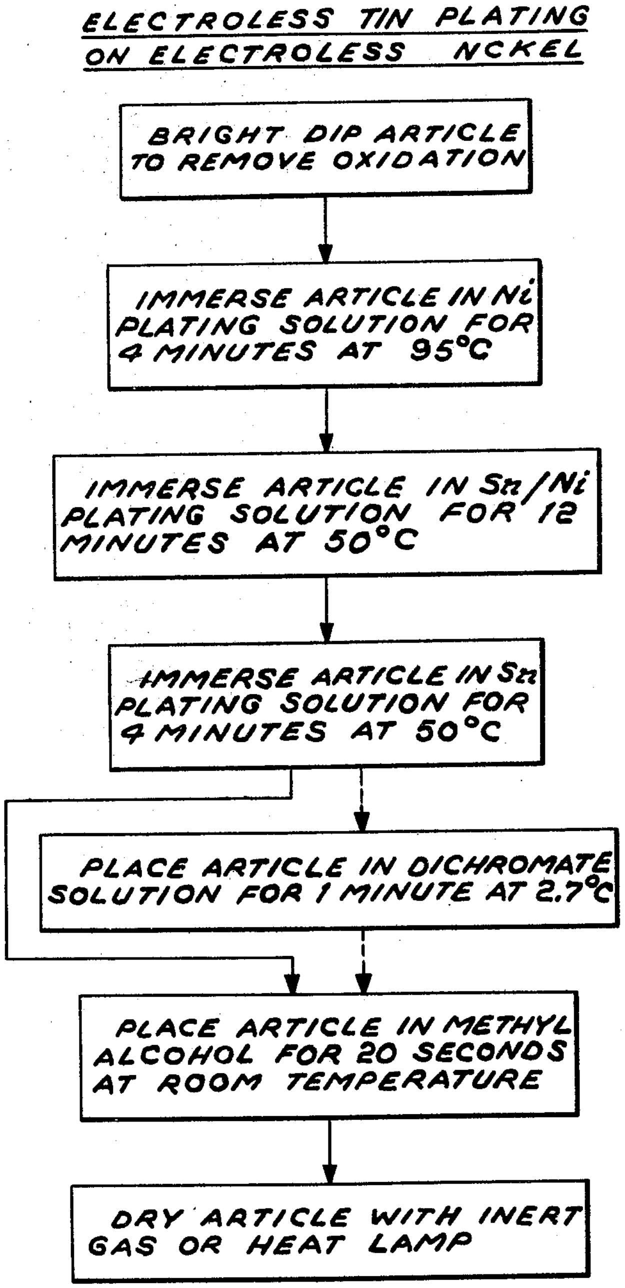
INVENTORS.
HANDEL H. JONES
KEMP MILLER

United States Patent Office 3,498,823
Patented Mar. 3, 1970

3,498,823

ELECTROLESS TIN PLATING ON ELECTROLESS NICKEL

Handel H. Jones, Sunnyvale, and Kemp Miller, Menlo Park, Calif., assignors to International Telephone and Telegraph Corporation, Nutley, N.J., a corporation of Delaware

Filed July 11, 1967, Ser. No. 652,537
Int. Cl. B32b *15/20;* B44d *1/14*
U.S. Cl. 117—71 8 Claims

ABSTRACT OF THE DISCLOSURE

A process for providing an adherent, humidity resistant, solderable protective coating on a copper substrate. After cleaning to remove any oxidation, the substrate is coated with a layer of electroless nickel. A transition layer is electrolessly deposited on the nickel layer by use of a mixture comprising a relatively large proportion of an electroless tin plating solution and a relatively small proportion of the electroless nickel plating solution. A layer of tin is then electrolessly deposited on the transition layer.

Background of the invention

This invention is directed to a process for providing a solderable protective coating on a metallic substrate by electroless plating techniques.

In the manufacture of electrical devices having metallic portions (e.g., copper) which may corrode upon exposure to water vapor and/or other deleterious substances, it is common practice to apply a suitable metallic plating to protect such portions. In cases where the metallic portions serve as electrical terminals for interconnecting leads, it is generally desirable that these portions, after the protective coating has been applied, be solderable.

Tin is readily soft solderable and is therefore often used as the protective coating. The tin coating may be applied by electroplating or by electroless (also known as chemical or "chemiplating") plating techniques. Where a large number of electrical devices is to be manufactured by batch process methods, the electroless technique is preferable, since electroplating necessitates the making of an electrical connection to each metallic portion to be plated. In contradistinction, electroless plating merely involves immersion of the substrate(s) to be coated in a suitable plating bath.

Unfortunately, however, electrolessly plated tin is quite porous. Thus, if a layer of tin were to be electrolessly plated directly upon the underlying substrate, water vapor and other substances could penetrate the electroless tin layer to cause corrosion of the substrate beneath.

Electrolessly plated nickel forms a non-porous, non-corrosive protective film. However, the nickel layer is quite difficult to solder to.

It is therefore evident that a desirable protective coating for a metallic substrate could be provided by first coating the substrate with a layer of electroless nickel, and subsequently providing an overlying layer of electroless tin on the electroless nickel layer. In such a case the electroless nickel would provide environmental protection for the substrate while the overlying electroless tin layer would insure solderability. Prior art attempts to provide such an electroless nickel-electroless tin laminate have been unsuccessful, in that it has not heretofore been possible to provide a tenacious layer of electroless tin on a tenacious layer of electroless nickel in a manner suitable for application for mass production batch process techniques.

An object of the present invention is to provide a protective, solderable coating for a metallic substrate including a layer of electroless nickel on the substrate surface and an overlying layer of electroless tin on the electroless nickel layer.

The drawing shows a flow diagram of the major process steps involved in practicing a preferred embodiment of the invention.

Summary

The present invention provides a process for forming on a metallic substrate a layer of electroless nickel and an adherent overlying layer of electroless tin, including the steps of electrolessly depositing a transition layer on the electroless nickel layer, the transition layer comprising a mixture of a relatively large proportion of an electroless tin plating solution and a relatively small proportion of an electroless nickel plating solution, and subsequently electrolessly depositing from an electroless tin plating solution a layer of electroless tin on the transition layer.

Detailed description

In the manufacture of electrical components such as, e.g., semiconductor diodes having copper "pigtail" leads, it is desirable to protect the leads against corrosion by plating the leads with a non-porous, non-corrosive layer of electroless nickel, and subsequently applying a layer of electroless tin in order to provide good solderability characteristics for the electrical connection of the leads to the other circuit components.

According to a preferred embodiment of the present invention, the copper leads are first cleaned in preparation for the deposition of the electroless nickel layer, by immersing the leads (and, if necessary, the entire electrical device) in a "bright dip" solution for the purpose of removing any oxidation products from the copper lead surfaces which may have been formed in previous manufacturing steps.

Where copper is the substrate material, we prefer to use a mixture of one part hydrochloric acid (1 molar solution) to 20 parts water. Other solutions may be used, depending upon the particular substrate metal to be cleaned. This cleaning step actually involves a slight etching of the copper surface to remove a very thin layer therefrom together with any undesirable contaminants present on the surface.

After the "bright dip" cleaning step, the device leads are rinsed in deionized water, and immersed in an electroless nickel plating solution. The electroless nickel plating solution is prepared by mixing the following ingredients in the indicated proportions:

| | | |
|---|---|---|
| Nickelous chloride | grams | 30 |
| Ammonium chloride | do | 50 |
| Ammonium citrate | do | 65 |
| Deionized water | liter | 1 |

The mixture is heated to a temperature on the order of 90° C. and sodium hypophosphite is added to the mixture in the proportion of 16 grams at the elevated temperature.

The leads to be plated are immersed in the nickel plating solution while the solution is maintained at a temperature of 95° C. The pH of the solution is adjusted to line between 8.5 and 9.0 by, if necessary, variation of the amount of sodium hypophosphite contained therein. The leads are left in the nickel plating solution for a time on the order of four minutes, after which the leads are removed from the solution and rinsed in deionized water at room temperature.

The next step involves application of the transition layer atop the nickel plated substrate by use of a mixture comprising, by volume, 10% of the aforementioned nickel plating solution and 90% of an electroless tin plating solution comprising the following ingredients in the indicated proportions:

| | |
|---|---|
| $SnCl_2$ ---grams-- | 17 |
| NaCN ---do---- | 175 |
| NaOH ---do---- | 21 |
| Deionized water ---liter-- | 1 |

The 90%–10% mixture of the electroless tin plating and electroless nickel plating solutions is then heated to a temperature on the order of 50° C. The leads are immersed in this composite solution for a time on the order of 12 minutes to provide a transition layer consisting of nickel and tin on the underlying electroless nickel layer.

The transition layer provides good adherence to the underlying electroless nickel layer and to the electroless tin layer to be subsequently deposited thereon.

After the transition layer has been formed, the leads are removed from the composite solution and rinsed in deionized water. The leads are subsequently placed in a solution comprising only the aforementioned electroless tin plating solution, which is maintained at a temperature on the order of 50° C. The leads are immersed in this electroless tin plating solution for a time on the order of 4 minutes, after which the leads are removed and rinsed in deionized water.

If a shiny surface is required, the electroles nickel-transition layer-electroless tin plated leads are then immersed in a dichromate solution maintained at a temperature of 2.7° plus or minus 3° C. for a time on the order of one minute. The dichromate solution comprises a mixture of the following ingredients in the indicated proportions:

| | |
|---|---|
| Sodium dichromate ---grams-- | 6 |
| $H_2SO_4$ ---ml-- | 100 |
| Deionized water ---ml-- | 400 |

After "cleaning" the leads in the dichromate solution, they are removed therefrom and rinsed once again in deionized water. As stated above this immersion in a dichromate solution is required only of a shiny surface is required.

The next step is utilized in all cases, whether the dichromate step has been used or not. The leads are cleaned to remove any undesirable contaminates formed in previous steps by placing them in a solution of methyl alcohol for a period of approximately 20 seconds. The leads are removed from the methyl alcohol solution and dried by exposure to a heat lamp, or to a flow of inert gas such as nitrogen.

It will be apparent to those skilled in the art that the specific parameters set forth above may be deviated from in specific cases without departing from the spirit of the invention. For example, depending upon the particular solution concentrations and desired composition of the electrolessly plated layers, the electroless plating temperatures may be varied by 5.20° C. The composite transition layer plating solution may vary in proportions by 5%, i.e. from approximately 85% tin plating solution/15% nickel plating solution to 95% tin plating solution/5% nickel plating solution. The plating times may be varied in accordance with the particular thicknesses desired for the various layers.

We claim:

1. A process for providing a solderable protective coating on a metallic substrate, comprising the steps of:
electrolessly plating a layer of nickel on a given surface of said substrate by immersing said substrate in a nickel plating solution;
subsequently immersing said substrate in a fluid comprising a relatively small proporation of said nickel plating solution and a relatively large proportion of an electroless tin plating solution; and
thereafter electrolessly plating a layer of tin on said surface by immersing said substrate in said tin plating solution.

2. A process according to claim 1, wherein said substrate comprises copper and said tin plating solution comprises a mixture in the proportions:

| | |
|---|---|
| $SnCl_2$ ---grams-- | 17 |
| NaCN ---do---- | 175 |
| NaOH ---do---- | 21 |
| $H_2O$ ---liter-- | 1 |

3. A process according to claim 2, wherein said nickel plating solution comprises a mixture in the proportions:

| | |
|---|---|
| Nickelous chloride ---grams-- | 30 |
| Ammonium chloride ---do---- | 50 |
| Ammonium citrate ---do---- | 65 |
| $H_2O$ ---liter-- | 1 |
| Sodium hypophosphite ---grams-- | 16 |

said sodium hypophosphite being added to the other ingredients after said other ingredients have been heated to a temperature on the order of 95° C.

4. A process according to claim 3, comprising the additional step of immersing said tin-plated substrate in a solution comprising a mixture in the following proportions:

| | |
|---|---|
| Sodium dichromate ---grams-- | 6 |
| Sulphuric acid (1 molar solution) ---ml-- | 100 |
| $H_2O$ ---ml-- | 400 |

5. A process according to claim 3, wherein said fluid comprises a volumetric mixture in the proportions of 90% said tin plating solution and 10% said nickel plating solution.

6. A process for providing a solderable protective coating on a copper substrate, comprising the steps of:
(1) electrolessly plating a layer of nickel on a given surface of said substrate by:
(a) preparing a mixture in the proportions of 30 grams nickelous chloride, 50 grams ammonium chloride, 65 grams ammonium citrate and 1 liter $H_2O$,
(b) heating said prepared mixture to a temperature on the order of 95° C.,
(c) adding sodium hypophosphite to said heated mixture in the proportion of 16 grams, and
(d) immersing said substrate in said sodium hypophosphite-containing mixture at a temperature on the order of 95° C. for a time on the order of 4 minutes;
(2) preparing a mixture consisting of, by volume, 10% of said sodium hypophosphite-containing mixture and 90% of a mixture having the proportions 17 grams $SnCl_2$, 175 grams NaCN, 21 grams NaOH and 1 liter $H_2O$;
(3) immersing said nickel-plated substrate in the mixture of step (2) at a temperature on the order of 50° C. for a time on the order of 12 minutes to electrolessly deposit a transition layer on said nickel layer; and
(4) electrolessly plating a layer of tin on said transition layer by:
(a) preparing a mixture in the proportions of 17 grams $SnCl_2$, 175 grams NaCN, 21 grams NaOH and 1 liter $H_2O$, and
(b) immersing said transition layer in the mixture of step 4 (a) at a temperature on the order of 50° C. for a time on the order of 4 minutes.

7. A process according to claim 6, comprising the additional step of:
(5) preparing a dichromate mixture in the proportions of (i) 6 grams sodium dichromate, (ii) 100 milliters sulphuric acid (1 molar solution) and (iii) 400 milliliters $H_2O$, and immersing said tin-plated substrate in said dichromate mixture for a time on the order of 1 minute.

8. A process according to claim 7, comprising the additional step of, prior to said nickel plating step, removing any oxidation from the surface of said substrate.

References Cited

UNITED STATES PATENTS

| | | | |
|---|---|---|---|
| 2,106,904 | 2/1938 | Wilhelm | 148—6.21 |
| 3,072,499 | 1/1963 | Cole et al. | |
| 3,077,421 | 2/1963 | Budninkas. | |
| 3,088,846 | 5/1963 | Lee. | |
| 3,264,199 | 8/1966 | Fassell et al. | |

DAVID KLEIN, Primary Examiner

U.S. Cl. X.R.

29—194, 199; 117—130, 217; 148—6.21; 156—20; 204—40